(12) United States Patent
Yang et al.

(10) Patent No.: US 7,777,308 B2
(45) Date of Patent: Aug. 17, 2010

(54) INTEGRATED CIRCUIT PACKAGES INCLUDING SINUOUS LEAD FRAMES

(75) Inventors: Se-Young Yang, Gyeonggi-do (KR); Sun-Won Kang, Seoul (KR); Yeo-Hoon Yoon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/259,824

(22) Filed: Oct. 28, 2008

(65) Prior Publication Data
US 2009/0146274 A1    Jun. 11, 2009

(30) Foreign Application Priority Data
Dec. 6, 2007    (KR) .................. 10-2007-0126229

(51) Int. Cl.
*H01L 23/495* (2006.01)
(52) U.S. Cl. ..................... 257/666; 257/686
(58) Field of Classification Search ............ 257/666, 257/693, 696, 686, 777
See application file for complete search history.

(56) References Cited

U.S. PATENT DOCUMENTS

| | | | | |
|---|---|---|---|---|
| 4,857,988 A | * | 8/1989 | Fottler | 257/693 |
| 5,389,739 A | * | 2/1995 | Mills | 174/540 |
| 5,554,886 A | * | 9/1996 | Song | 257/666 |
| 5,821,615 A | * | 10/1998 | Lee | 257/686 |
| 6,081,029 A | * | 6/2000 | Yamaguchi | 257/718 |
| 6,114,759 A | * | 9/2000 | Okuaki | 257/692 |
| 6,383,840 B1 | * | 5/2002 | Hashimoto | 438/109 |

FOREIGN PATENT DOCUMENTS

| | | |
|---|---|---|
| JP | 5-13647 A | 1/1993 |
| JP | 2001-257309 A | 9/2001 |
| KR | 10-0232214 B1 | 9/1999 |

\* cited by examiner

*Primary Examiner*—S. V Clark
(74) *Attorney, Agent, or Firm*—Myers Bigel Sibley & Sajovec, P.A.

(57) ABSTRACT

Integrated circuit packages include an integrated circuit mounting substrate having a hole that defines an inner wall of the integrated circuit mounting substrate. An integrated circuit is provided in the hole. A sinuous lead frame extends from the integrated circuit and is connected to the inner wall. The sinuous lead frame extends back and forth along a given direction, and may include a U- and/or V-shape, and round and/or jagged portions. Related packaging methods are also disclosed.

20 Claims, 9 Drawing Sheets

INTEGRATED CIRCUIT PACKAGES INCLUDING SINUOUS LEAD FRAMES

CROSS-REFERENCE TO RELATED PATENT APPLICATION

This application claims priority under 35 USC §119 to Korean Patent Application No. 10-2007-0126229, filed on Dec. 6, 2007, the disclosure of which is hereby incorporated herein by reference in its entirety as if set forth fully herein.

FIELD OF THE INVENTION

The present invention relates to integrated circuits and, more particularly, to integrated circuit packages and methods of manufacturing the same.

BACKGROUND OF THE INVENTION

Integrated circuits are widely used in consumer, commercial and many other applications. An integrated circuit includes a semiconductor die or chip which may be encapsulated. A lead frame may extend from the integrated circuit to facilitate the external connections to an integrated circuit mounting substrate. The mounting substrate may be a Printed Circuit Board (PCB).

In order to increase the density of integrated circuit packages, stack-type packages, where a plurality of chips are mounted inside an individual package, have been developed. As the thickness of electronic products containing the packages becomes thinner, smaller and/or lighter, it is desirable for the individual packages to become thinner.

Moreover, in order to increase the density of integrated circuit packages, it may be desirable to mount individual integrated circuits inside the printed circuit board. Accordingly, techniques for stacking individual packages vertically in and/or on the printed circuit board are being developed.

However, it is not easy to mount a plurality of stacked packages on the printed circuit board, while allowing acceptable Solder Joint Reliability (SJR) between the printed circuit board and the lead frame contained. More specifically, in the package structure, a conductive pattern formed on the printed circuit board and a lead frame contained in a package generally are bonded to each other by solder material therebetween. Because coefficients of thermal expansion are generally different between the printed circuit board and the lead frame, when heat is applied to the printed circuit board or the lead frame, the printed circuit board and the lead frame may expand differently. Thus, at the bonding region between the printed circuit board and the lead frame, problems such as crack creation frequently occur.

Moreover, when a plurality of integrated circuits are stacked on the printed circuit board, the thickness of the package generally increases due to the protruding integrated circuits on the surface of the printed circuit board. In attempts to provide thinner integrated circuits, very very thin exposed lead frame package (WELP) packages with bendless lead frames, and Thin Small Outline Package (TSOP) packages have been developed. Because the WELP-type package does not have any bent shape in the lead frame reaching from the package mold to the bonding region, it may not have sufficient compliance of the lead frame. Thus, compensation of the difference of coefficients of thermal expansion between the printed circuit board and the lead frame may not be attainable. Therefore, bonding failure between the circuit board and the lead frame may occur.

Finally, even if a plurality of integrated circuits are stacked vertically on a printed circuit board, lead frames inputting and outputting signals to the packages may be connected to one another, and thereby, each stacked package may not be operated individually at the same time. Therefore, operating speed of each package which is mounted on the printed circuit board may become slow.

SUMMARY OF THE INVENTION

Integrated circuit packages according to various embodiments of the present invention include an integrated circuit mounting substrate having a hole therein that defines an inner wall of the integrated circuit mounting substrate. An integrated circuit is provided in the hole. A sinuous lead frame extends from the integrated circuit and is connected to the inner wall. In some embodiments, the sinuous lead frame may include a U- and/or V-shaped sinuous lead frame. In other embodiments, a round and/or jagged sinuous lead frame may be provided. In still other embodiments, the sinuous lead frame extends back and forth along a given direction.

In some embodiments, the inner wall includes a step therein, and the sinuous lead frame extends from the integrated circuit and is connected to the step. Moreover, in other embodiments, the integrated circuit is a first integrated circuit, the step is a first step, and the sinuous lead frame is a first sinuous lead frame. The inner wall includes a second step therein, and the package further comprises a second integrated circuit in the hole, and a second sinuous lead frame that extends from the second integrated circuit, and is connected to the second step. A third integrated circuit may also be provided overlying the hole. A third sinuous lead frame extends from the third integrated circuit and may be connected to a face of the integrated circuit mounting substrate outside the hole and/or may be connected to the first sinuous lead frame.

In some embodiments, the first and second steps are symmetrical relative to a central axis of the hole, and the first and second integrated circuits are in the hole symmetrically relative to the central axis of the hole. In other embodiments, the first and second steps may be offset from one another relative to the central axis of the hole, and the first and second integrated circuits may be in the hole symmetrically relative to the central axis of the hole. Moreover, the integrated circuit mounting substrate may include one or more internal conductive patterns, wherein a given step exposes a respective internal conductive pattern in the hole. The sinuous lead frame(s) may be connected to the internal conductive layer(s) that is/are exposed by the step(s).

In any of the embodiments described herein, the hole may not extend completely through the integrated circuit mounting substrate. However, in other embodiments, the hole may be a through hole that extends completely through the integrated circuit mounting substrate.

Moreover, in any of the embodiments described herein, an encapsulant may be provided in or filling the hole, and that includes an outer surface that is coplanar with a face of the integrated circuit mounting substrate.

Integrated circuit packages according to other embodiments of the invention may include an integrated circuit and a sinuous lead frame that extends from the integrated circuit. The sinuous lead frame may be U-shaped, V-shaped, rounded, jagged and/or may extend back and forth along a given direction, as described above.

Finally, integrated circuit packaging methods according to various embodiments of the present invention include placing an integrated circuit having a sinuous lead frame that extends therefrom into a hole in an integrated circuit mounting substrate and electrically connecting the sinuous lead frame to an inner wall of the hole. Packaging methods for any of the package embodiments as described herein may also be provided.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp point may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Integrated circuit packages according to various embodiments of the invention can include stacked integrated circuits in a hole of a mounting substrate, such as a printed circuit board, and hence, the thickness protruded beyond the surface of the printed circuit board can be reduced. Accordingly, package structures according to various embodiments of the invention may be thin and may have high capacity. Also, because the lead frame contained in the package can have a sinuous shape, lead compliancy may be secured and bonding reliability between the lead frame and the printed circuit board may be improved.

In the description that follows, an integrated circuit may be referred to as a chip. Moreover, a mounting substrate may be referred to as a printed circuit board. However, it will be understood that other mounting substrates, such as multilayer ceramic substrates, may be used.

Figure 1:
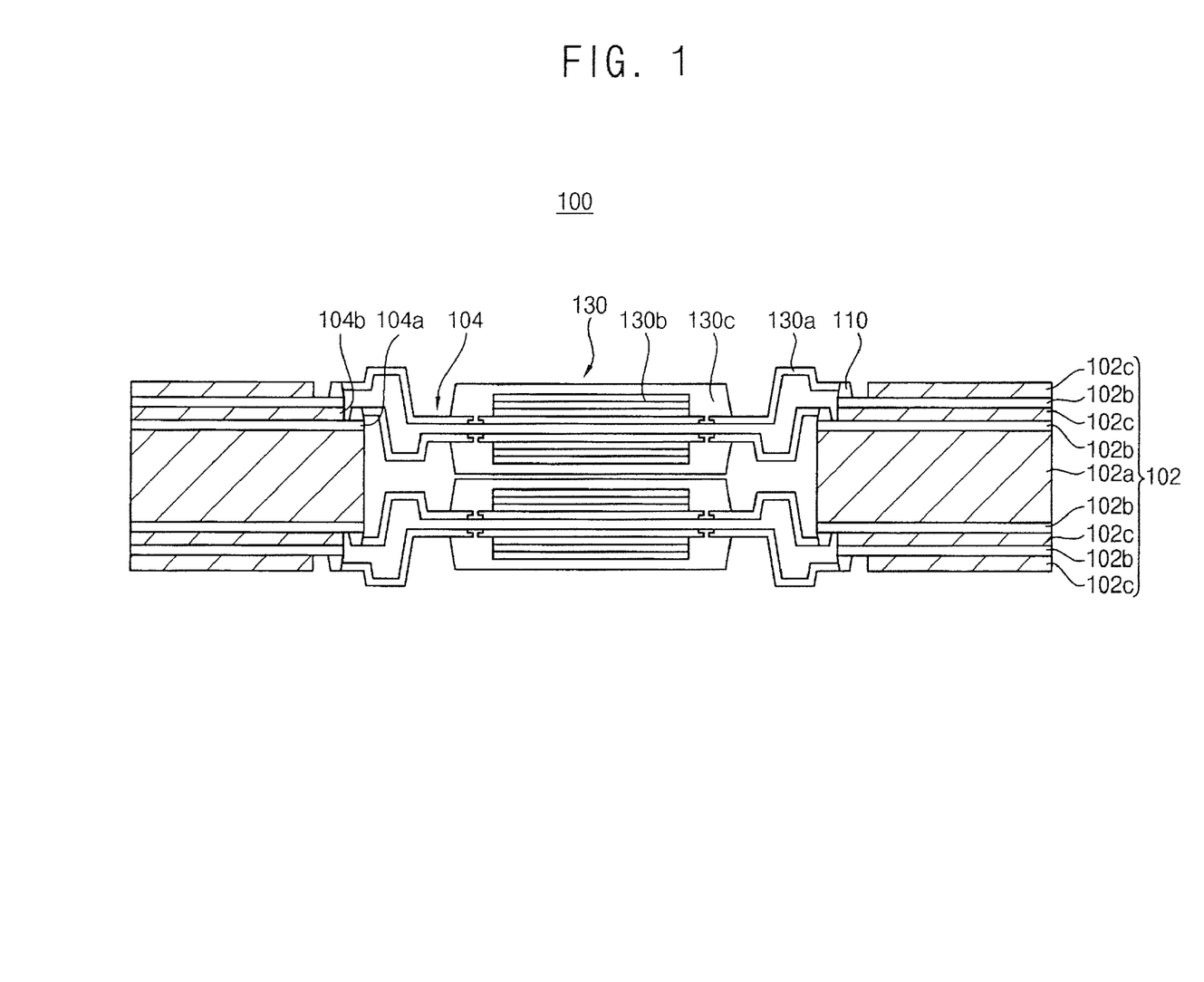
FIG. 1 is a cross-section of an integrated circuit package in accordance with various embodiments of the present invention.
Figure 2:
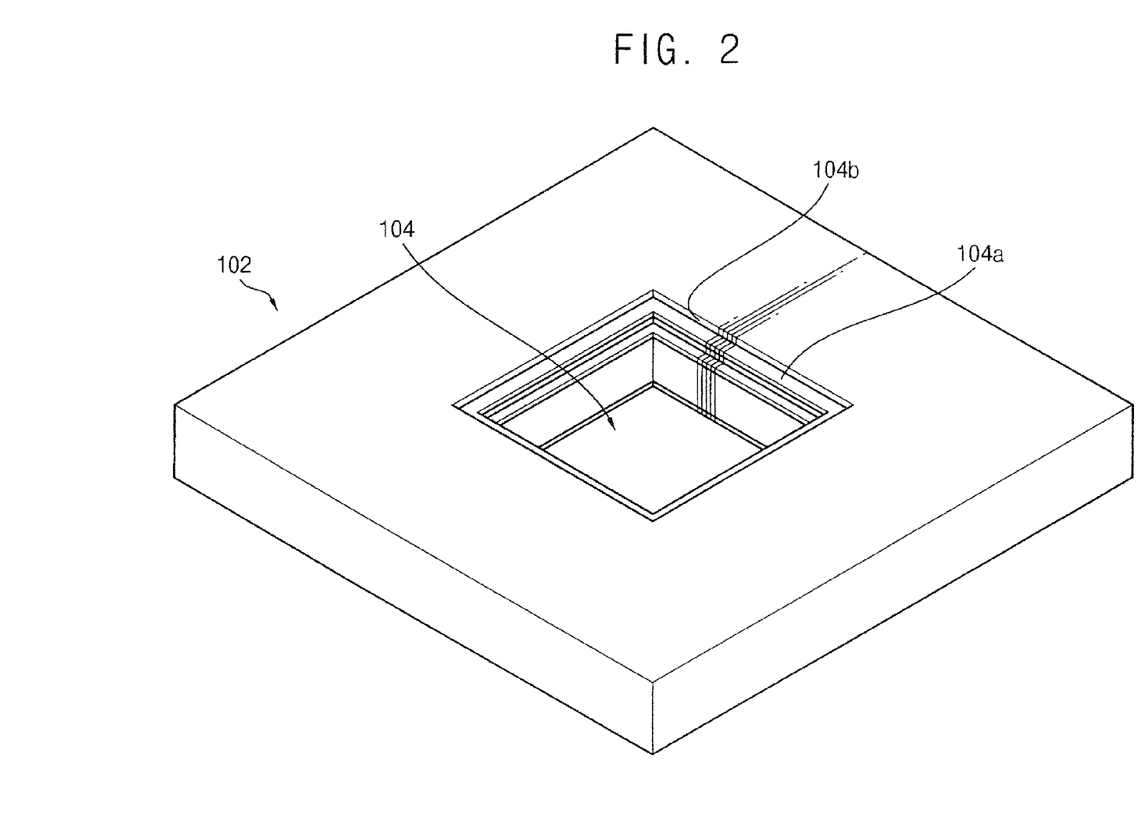
FIG. 2 is a perspective view showing only the printed circuit board in the package structure of FIG. 1.

FIG. 1 is a cross section of an integrated circuit package structure in accordance with various embodiments of the invention. FIG. 2 is a perspective view illustrating only the printed circuit board in FIG. 1.

Referring to FIG. 1 and FIG. 2, an integrated circuit package structure 100 according to various embodiments of the present embodiment contains a printed circuit board 102 and a plurality of stacked integrated circuits 130.

The printed circuit board 102 comprises a structure where an insulating layer and a conductive pattern or layer 102b are repeatedly stacked. In some embodiments, the insulating layer contains a core layer 102a and an insulating polymer layer 102c. For example, the printed circuit board 102 contains a core layer 102a comprising insulating material in its center, and a conductive pattern 102b and an insulating polymer layer 102c may be repeatedly stacked on top and bottom surfaces of the core layer, respectively. The conductive pattern 102b contained in the printed circuit board may comprise copper, gold, aluminum, etc. Many other integrated circuit mounting substrates including one or more internal conductive patterns may be providing according to various embodiments of the present invention.

A through hole 104 penetrating from a top surface of the printed circuit board to its bottom surface is provided in the printed circuit board 102. The insulating layer and the conductive pattern 102b are exposed on the sidewall or inner wall of the through hole 104.

The sidewall of the through hole 104 contains a step shape. A portion of the upper surface of the conductive pattern 102b is exposed on a flat region 104a of the step shape in the through hole 104. Also, the sidewall of the conductive pattern 102b and the sidewall of the insulating layer are exposed on the vertical region 104b of the step shape in the through hole.

As illustrated, the step shape of the sidewall of the through hole 104 may be formed symmetrically with reference to the core layer 102a which is located in the center of the printed circuit board 102. However, when the number of packages stacked in the through hole 104 is small, the step shape may need not be formed symmetrically. The step shape may also be symmetrical with reference to a central axis of the through hole 104 (i.e., a vertical axis centered about the through hole 104 in FIG. 1).

A sinuous lead frame 130a of the integrated circuit 130 is bonded on the conductive pattern 102b which is formed on the flat region of the step shape in the through hole 104. Therefore, the number of the step shapes of the sidewall of the through hole 104 is the same as or greater than the number of integrated circuits stacked in the through hole 104, in some embodiments.

A plurality of integrated circuits 130 is vertically stacked in the through hole 104. One or more of the integrated circuits 130 may be a multi-stacked integrated circuit package where a plurality of chips 130b is stacked in a mold (encapsulant) 130c. In other embodiments, one or more of the integrated circuits may be a package where only a single chip is formed in the mold 130c.

The integrated circuits 130 which are provided in the through hole 104 contain sinuous lead frames 130a for input and output of electric signals. The lead frames may comprise metal material, and for example, may comprise aluminum alloy, copper, etc. As used herein, a sinuous lead frame extends back and forth along a given direction. For example, as shown in FIG. 1, the sinuous lead frame 130a extends generally upward and then generally downward. In some embodiments the sinuous lead frame may comprise a rounded (curved) and/or a jagged (pointed) sinuous lead frame. A given lead frame may have both rounded and jagged portions. Moreover, the overall shape of the sinuous lead frame may be U-shaped (for example, an arc of a circle, ellipse and/or other ellipsoidal structure) or V-shaped (for example, with one or more points). Moreover, multiple such structures, such as a U-∩ or a W-shaped structure, may be provided. Various combinations and subcombinations of these sinuous lead frames may be provided. Additional embodiments will be described below.

The lead frame 130a of the integrated circuit 130 is bonded to the sidewall of the through hole 104. In FIG. 1, a plurality of integrated circuits is stacked in the through hole 104 for explanation. However, fewer or greater than four integrated circuits may be stacked, and a single integrated circuit may be provided.

The lead frame 130a of the integrated circuit 130 is bonded to the conductive pattern 102b which is located on the flat region of the step shape of the sidewall in the through hole 104. Between the edge portion of the lead frame 130a and the conductive pattern 102b is engaged a solder material 110, which bonds the edge portion onto the conductive pattern 102b. The solder material 110 may comprise conductive material, and for example, may comprise tin (Sn), an alloy of silver (Ag) and copper (Cu), an alloy of tin (Sn) and silver (Ag), etc. Other bonding materials, such as braze, and/or other bonding techniques, such as ultrasonic bonding or welding may be used.

An integrated circuit 130 may be connected to each flat region of the sidewall in the through hole 104. Also, each lead frame 130a of each stacked integrated circuit may be connected to each conductive pattern exposed on each flat region of the sidewall. In other words, each lead frame 130a of each integrated circuit 130 may be bonded to different flat regions constituting step shapes, respectively, which enables the stacked chips to operate in parallel.

As described above, the integrated circuits 130 stacked on the printed circuit board 102 may be connected in parallel for each separate input and output operation, and therefore, individual operation may be possible as to each integrated circuit. In other words, because contact between lead frames contained in each integrated circuit is not made in some embodiments, an electric signal need not be input or output in common as to the stacked integrated circuits 130. Therefore, package structures in accordance with various embodiments of the present embodiment may operate with a speed higher than that of a stacked integrated circuit structure which is operated in series. However, in other embodiments, some common signals may be provided.

At least a portion of the lead frame 130a extending from the mold 130c to the bonding region of the printed circuit board 102 has sinuous shape. When the lead frames 130a have sinuous shapes, stress generated due to the difference between the coefficients of the lead frame 130a and the printed circuit board 102 may be mitigated. Accordingly, solder bonding reliability of the bonding region between the lead frames 130a and the printed circuit board 102 may be increased.

When the thickness of each integrated circuit which is stacked in through hole 104 is small, many integrated circuits can be stacked without protruding onto the surface of the printed circuit board 102. Therefore, in some embodiments, the integrated circuits can use a WELP-type package whose thickness is small or a TSOP-type package. However, according to some embodiments of the invention, the lead frame 130a contained in the stacked package has a sinuous shape which is contrary to a conventional WELP-type or TSOP-type package, even if it is a WELP-type package wherein its lead frame is positioned on the upper or the lower part of the mold. Also, sufficient compliancy may be secured, because the lead frame 130a may be bonded on the sidewall of the through hole.

In some embodiments, the upper surface of the uppermost integrated circuit among the stacked integrated circuits 130 is positioned in the same plane as, or lower than the outer surface of the printed circuit board 102. Also, among the stacked integrated circuits 130, the lower surface of the lowermost package may be positioned higher than, or on the same plane as the lower surface of the printed circuit board 102. In these embodiments, because the integrated circuits stacked in the through hole 104 need not protrude onto the upper or the lower surfaces of the printed circuit board 102, a package structure having the same thickness as the printed circuit board 102 may be implemented.

Methods of manufacturing a package structure as shown in FIG. 1 will now be described.

As illustrated in FIG. 2, a printed circuit board 102 including a through hole 104 is provided. The through hole 104 included in the printed circuit board 102 exposes a sidewall or inner wall which has step shapes.

The printed circuit board 102 may be formed by stacking an insulating layer and a conductive pattern 102b sequentially. The insulating layer may comprise a core layer 102a and an insulating polymer layer 102c. In each insulating layer and each conductive pattern for the printed circuit board 102, holes having different sizes may be formed, respectively, and then by bonding these layers, the through hole 104 having step shapes in the printed circuit board 102 can be formed. The bonding between each layer may be performed by thermal pressing and/or other techniques.

The upper surface of the conductive pattern 102b is exposed on the flat region of the step shape constituting the sidewall of the printed circuit board 102. Then, integrated circuits 130 which are to be included in the through hole 104 are provided. By bending lead frames 130a contained in the integrated circuits, lead frames with sinuous shapes are formed.

Then, the integrated circuits 130 are mounted in the through hole 104, and the lead frames are bonded on the sidewall. By repeating mounting and bonding of the integrated circuits 130, the integrated circuits are stacked vertically in the through hole 104, and thereby the package structure as shown in FIG. 1 is completed.

The integrated circuits 130 are bonded on the flat regions 104a of the step shapes exposed in the printed circuit board 102, respectively. In some embodiments, by engaging conductive solder material between the lead frames of the integrated circuits 130 and the conductive patterns 102b exposed on the flat regions of the step shapes, the lead frames are bonded to the conductive patterns 102b. Also, each integrated circuit stacked in the through hole 104 may be operated in parallel, which is implemented by bonding the lead frames 130a contained in the packages 130 onto mutually different flat regions of the step shapes, respectively.

Figure 3:
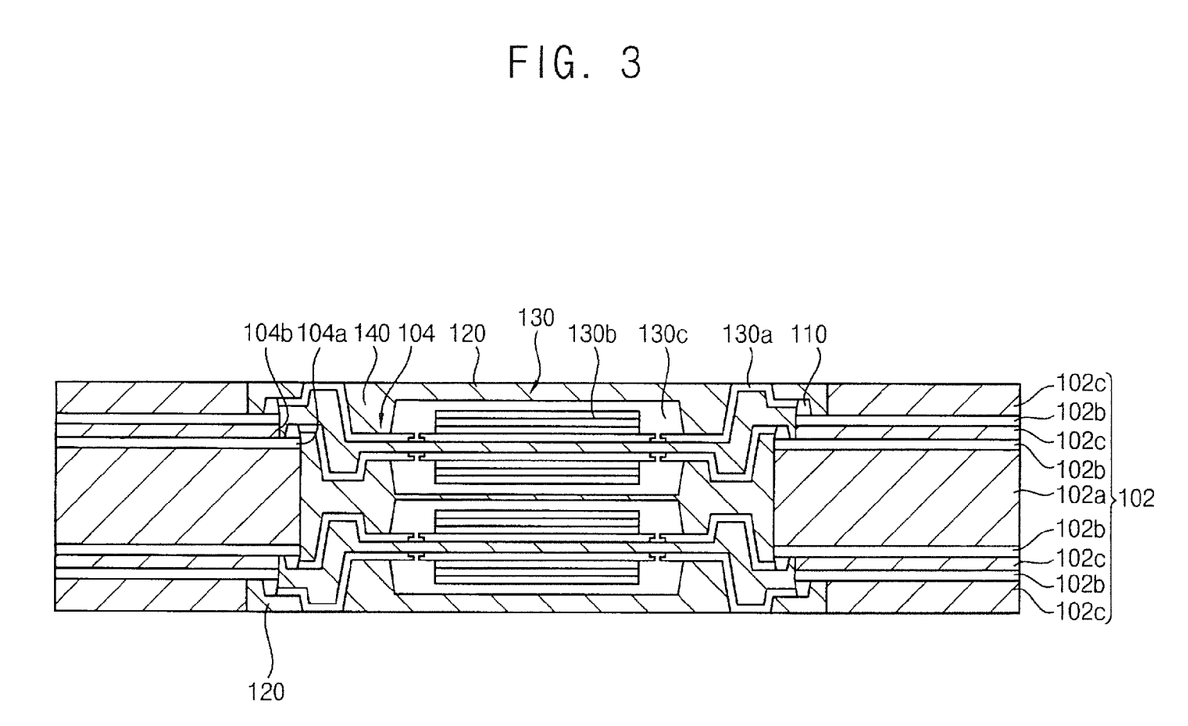
FIG. 3 is a cross-section of an integrated circuit package in accordance with other embodiments of the present invention.

FIG. 3 illustrates a cross section of a package structure in accordance with other embodiments of the present invention. Package structures of FIG. 3 can have the same configuration as package structures in FIG. 1, except that an encapsulant is in or filled in the through hole. Accordingly, like reference numerals represent like elements and repetitive explanation for the same elements is omitted for brevity.

Referring to FIG. 3, an encapsulant 140 is placed in the through hole wherein integrated circuits are stacked. The encapsulant 140 can fill the through hole in some embodiments. The integrated circuits positioned in the through hole do not protrude from the upper or the lower surfaces of the printed circuited board, and the encapsulant completely cover the integrated circuits, in some embodiments. However, as illustrated, portions of the lead frames connected to the uppermost and the lowermost packages may be exposed, in some embodiments.

The encapsulant can protect the packages from being damaged, even though external shock is applied on them. The encapsulant may comprise Epoxy Moulding Compound (EMC) and/or other encapsulants.

Package structures according to FIG. 3 may be formed in the same manner as disclosed in FIG. 2, except for filling the encapsulant.

Package structures according to FIG. 3 can reduce damage due to an external shock, and can improve mechanical reliability.

Figure 4:
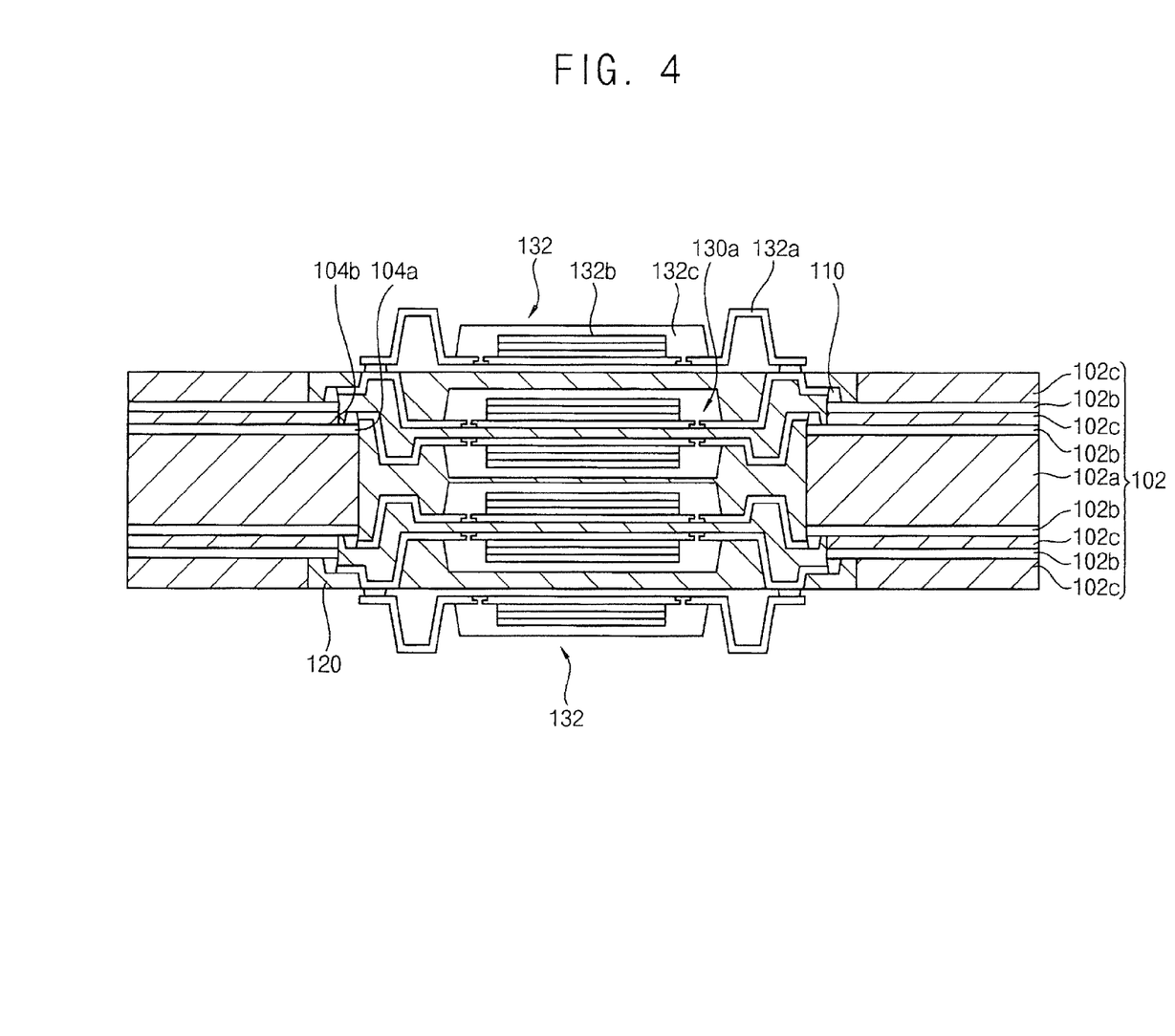
FIG. 4 is a cross-section of an integrated circuit package in accordance with yet other embodiments of the present invention.

FIG. 4 represents a cross section of a package structure in accordance with yet other embodiments of the present invention.

Package structures according to FIG. 4 can contain substantially the same elements as disclosed in FIG. 3, except that integrated circuit(s) also are protruded outside the through hole. Accordingly, like numerals represent like elements and repetitive explanation as to the same elements is omitted for brevity.

Referring to FIG. 4, a package structure contains a printed circuit board 102 having a through hole and a plurality of integrated circuits 130 stacked in the through hole. An encapsulant 120 is in or filled in the through hole. As illustrated, some portions of the lead frames 130a of the uppermost integrated circuit and the lowermost integrated circuit in the through hole are exposed on the surface of the encapsulant 120.

An upper integrated circuit and a lower integrated circuit are provided on the top and the bottom of the encapsulant 120, respectively. A lead frame 132a connected to the upper integrated circuit formed on the top of the encapsulant 120 is bonded on the lead frame 130a which is in the through hole and whose portion is exposed on the upper surface of the encapsulant 120. Also, the lead frame 132a connected to the lower integrated circuit positioned below the encapsulant 120 is bonded on the lead frame 130a which is in the through hole and whose portion is exposed on the lower surface of the encapsulant 120. In other words, the upper and the lower integrated circuits protruding from the surfaces of the printed circuit board 102 can use the lead frames of the underlying integrated circuits 130 as pads. Thus, FIG. 4 illustrates integrated circuits that overlie and/or underlie the hole, wherein an integrated circuit that overlies the hole includes a lead frame, which may be a sinuous lead frame, that is connected to an underlying and/or overlying sinuous lead frame of an adjacent integrated circuit.

Figure 5:
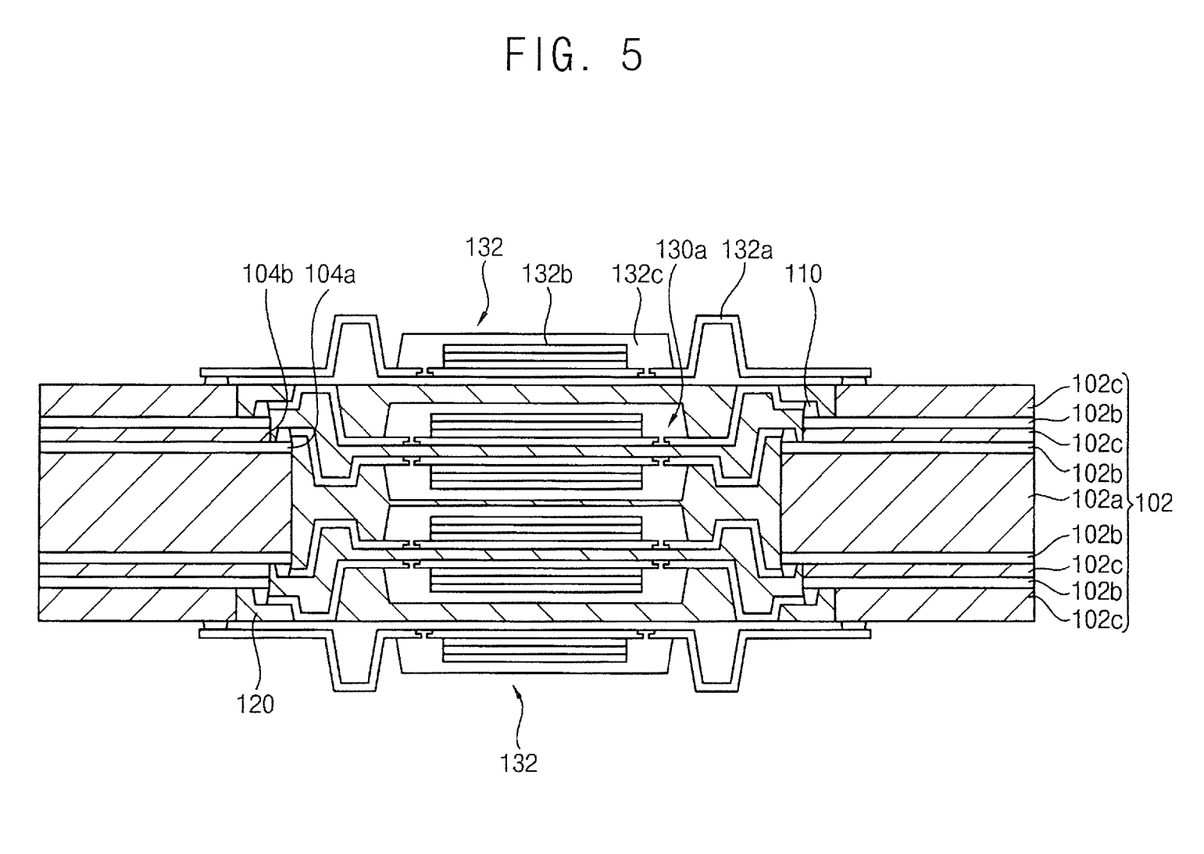
FIG. 5 is a cross-section of an integrated circuit package in accordance with still other embodiments of the present invention.

In contrast, FIG. 5 illustrates other embodiments of the present invention wherein integrated circuits are also provided that overlie/underlie the hole, but that include lead frames that extend to a face of the integrated circuit mounting substrate outside the hole. These lead frames may be sinuous or may not be sinuous. Accordingly, these overlying/underlying integrated circuits may also operate independent of the remaining integrated circuits.

Package structures according to FIGS. 4 and 5 contain packages stacked in the through hole and packages protruded onto the surface of the printed circuit board, which can increase the storage capacity of the package structure.

Methods of manufacturing package structures of FIGS. 4 and 5 can be the same as methods of manufacturing package structures disclosed in FIG. 2, further including stacking packages on the top and/or the bottom of the encapsulant after injecting the encapsulant, and bonding the lead frames of packages stacked on the encapsulant onto the lead frames of the underlying packages which are exposed on the surface of the encapsulant and/or to the printed circuit board outside the through hole. In other embodiments, the encapsulant is placed in the through hole after the overlying/underlying integrated circuits are mounted.

Figure 6:
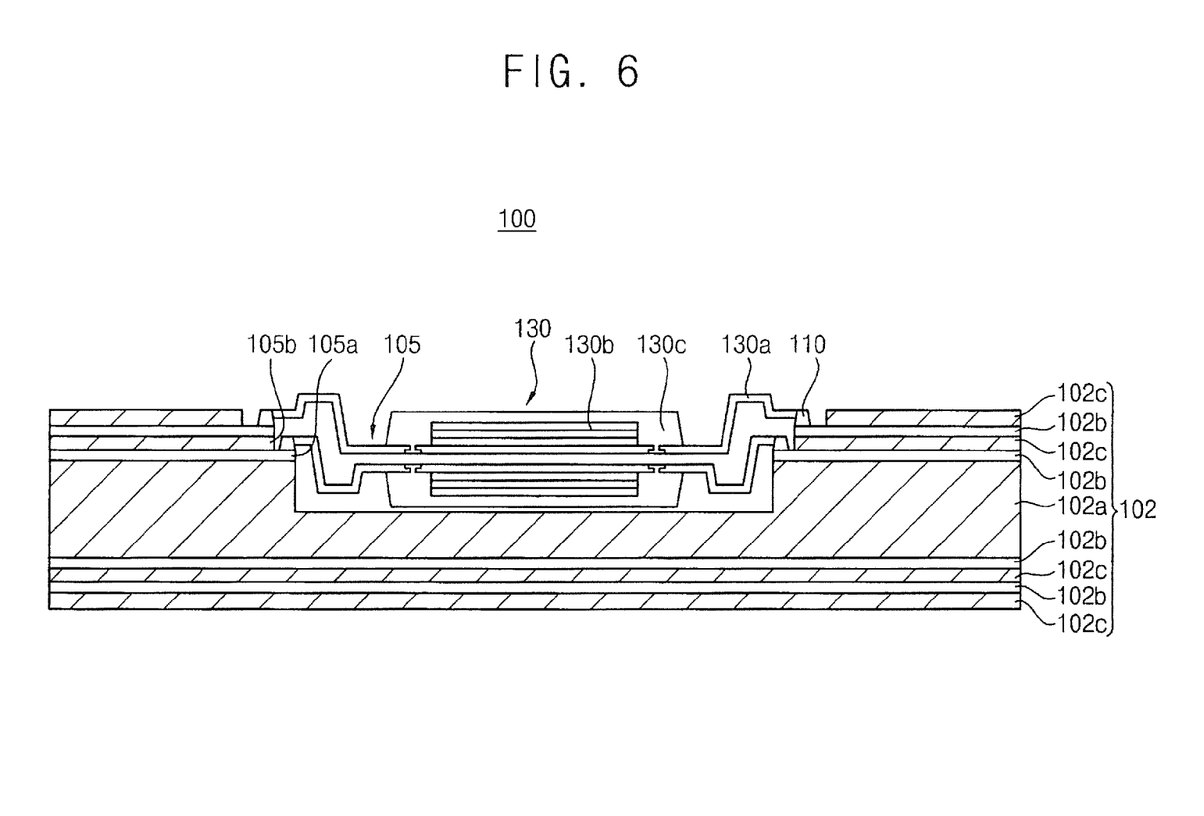
FIG. 6 is a cross-section of an integrated circuit package in accordance with yet still other embodiments of the present invention.

FIG. 6 represents a cross section of a package structure according to various other embodiments.

Package structures according to FIG. 6 can include the same configuration as package structures of the other embodiments, except that a hole which does not penetrate the printed circuited board is formed in the board. Accordingly, like reference numerals represent like elements and repetitive explanation as to the same elements is omitted for brevity.

Referring to FIG. 6, a hole 105 which does not penetrate the printed circuit board is provided in the board 102. The sidewall or inner wall of the hole 105 has step shapes that can be identical to the sidewall of the through hole as disclosed in previous embodiments. Also, lead frames of the packages 130 are bonded on the flat region 105a of the step shapes, respectively.

Package structures according to FIG. 6 may be manufactured in the same manner as disclosed above, except for the process of forming the hole inside the printed circuit board.

Package structures according to FIG. 6 may have improved mechanical reliability compared to package structures having a through hole.

FIGS. 7A-7H are partial cross-sections of integrated circuits 130 according to various embodiments of the present invention illustrating various configurations of sinuous lead frames 130a according to various embodiments of the present invention. Any of the embodiments of FIGS. 7A-7H may be used in embodiments of FIGS. 1-6. Moreover, the lead frames need not be same for each integrated circuit, and may not be the same within a given integrated circuit.

Figure 7A:
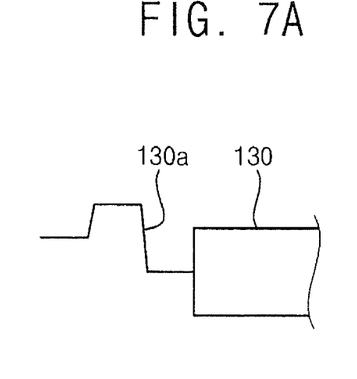
FIGS. 7A-7H are cross-sectional views of sinuous lead frames in accordance with various embodiments of the present invention.
Figure 7B:
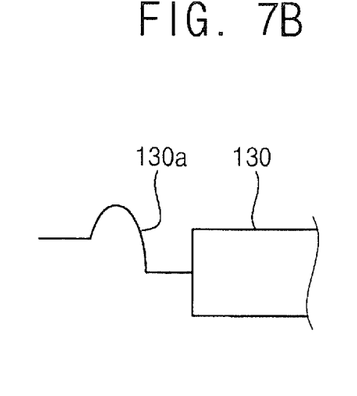
Figure 7C:
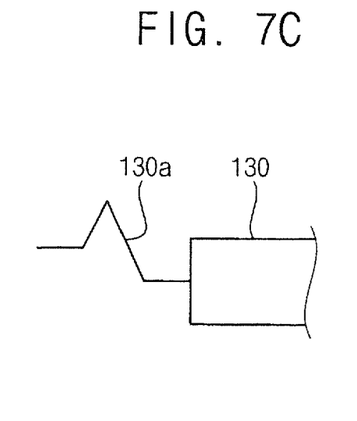
Figure 7D:
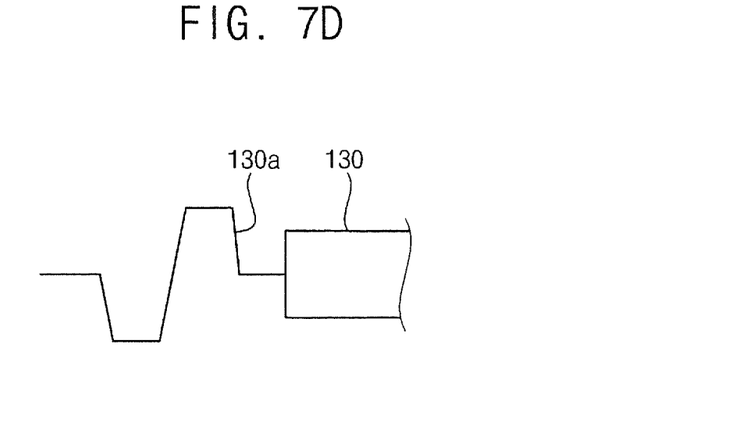
Figure 7E:
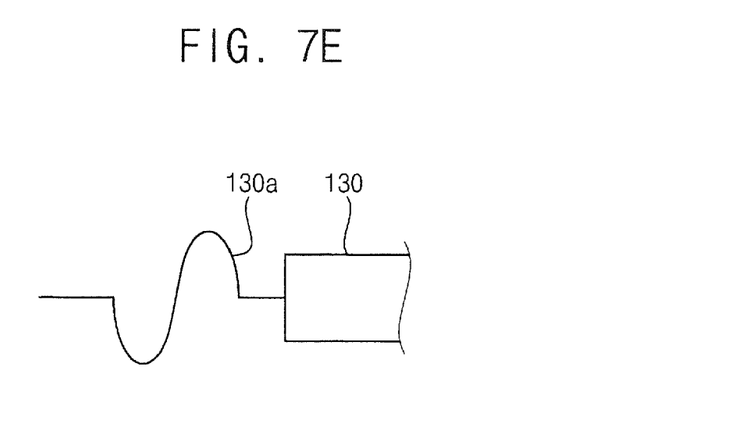
Figure 7F:
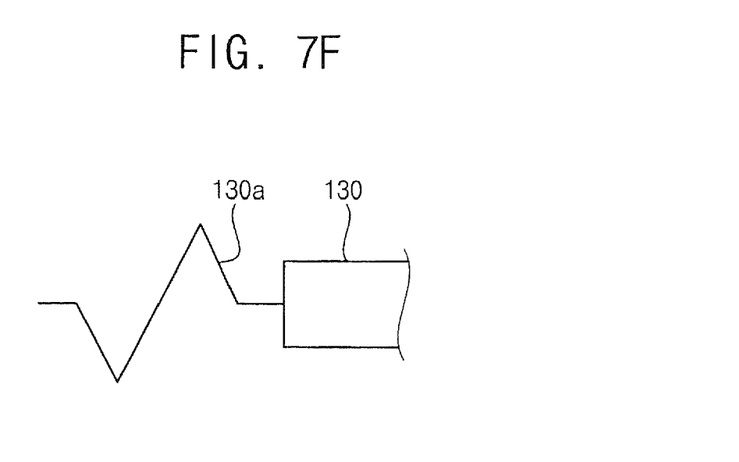
Figure 7G:
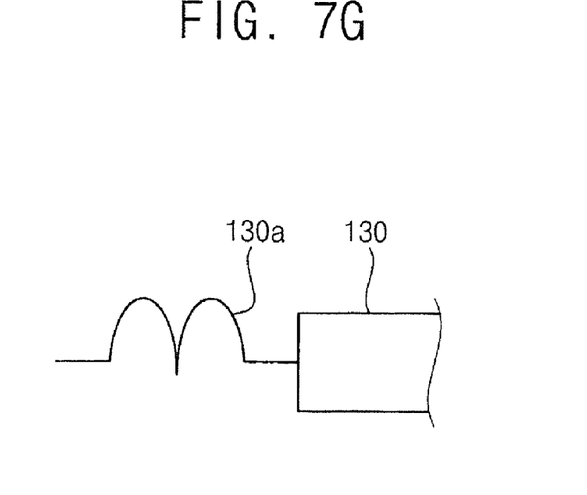
Figure 7H:
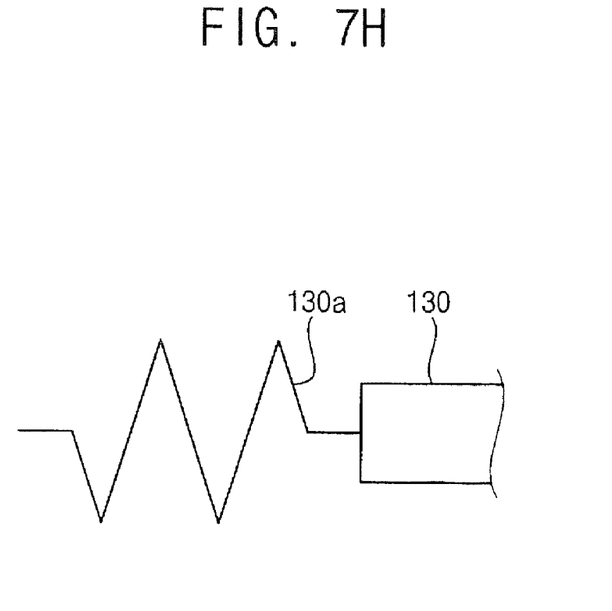

FIGS. 7A, 7C, 7D, 7F and 7H illustrate jagged (e.g., V-shaped) sinuous lead frames, whereas FIGS. 7B, 7E and 7G illustrate rounded (e.g., U-shaped) lead frames. FIG. 7G illustrates a combination of rounded and jagged sinuous lead frames. Moreover, FIGS. 7A, 7B, 7D, 7E and 7G illustrate U-shaped sinuous lead frames, whereas FIGS. 7C, 7F and 7H illustrate V-shaped sinuous lead frames. In all embodiments of FIG. 7A-7H, the sinuous lead frames extend back and forth along a given direction (the vertical direction of FIG. 7A-7H). Moreover, multiple extensions are illustrated in FIGS. 7D-7H. In any of the embodiments of FIGS. 7A-7H, the legs of the lead frame may be same length or may be of different lengths. Moreover, various combinations and subcombinations of these and/or other embodiments of sinuous lead frames may be used.

As described above, package structures according to various embodiments of the present invention can provide a low mounting height, and individual chips mounted in the structure may be operated in parallel, to allow high speed operation. Accordingly, package structures of various embodiments of the present invention can be applied to electronic products for which reduced thickness and/or high speed operation are desired.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An integrated circuit package comprising:
   an integrated circuit mounting substrate including a hole therein that defines an inner wall of the integrated circuit mounting substrate;
   an integrated circuit in the hole; and
   a sinuous lead frame that extends from the integrated circuit and is connected to the inner wall,
   wherein the inner wall includes a step therein and wherein the sinuous lead frame extends from the integrated circuit and is connected to the step; and
   wherein the integrated circuit is a first integrated circuit, wherein the step is a first step, wherein the sinuous lead frame is a first sinuous lead frame, wherein the inner wall includes a second step therein and wherein the package further comprises:
   a second integrated circuit in the hole; and
   a second sinuous lead frame that extends from the second integrated circuit and is connected to the second step.

2. A package according to claim 1 wherein the first and second sinuous lead frames comprise U- and/or V-shaped sinuous lead frames.

3. A package according to claim 1 wherein the first and second sinuous lead frames comprise rounded and/or jagged sinuous lead frames.

4. A package according to claim 1 wherein the first and second sinuous lead frames extend back and forth along a given direction.

5. An integrated circuit package comprising:
   an integrated circuit mounting substrate including a hole therein that defines an inner wall of the integrated circuit mounting substrate;
   an integrated circuit in the hole; and
   a sinuous lead frame that extends from the integrated circuit and is connected to the inner wall,
   wherein the inner wall includes a step therein and wherein the sinuous lead frame extends from the integrated circuit and is connected to the step; and
   wherein the integrated circuit is a first integrated circuit, wherein the sinuous lead frame is a first sinuous lead frame and wherein the package further comprises:
   a second integrated circuit overlying the hole; and
   a second sinuous lead frame that extends from the second integrated circuit and is connected to the first sinuous lead frame.

6. A package according to claim 1 further comprising:
   a third integrated circuit overlying the hole; and
   a third sinuous lead frame that extends from the third integrated circuit and is connected to a face of the integrated circuit mounting substrate outside the hole.

7. A package according to claim 1 further comprising:
   a third integrated circuit overlying the hole; and
   a third sinuous lead frame that extends from the third integrated circuit and is connected to the first sinuous lead frame.

8. A package according to claim 1 wherein the hole does not extend completely through the integrated circuit mounting substrate.

9. A package according to claim 1 wherein the hole is a through hole that extends completely through the integrated circuit mounting substrate.

10. A package according to claim 1 wherein the first and second steps are symmetrical relative to a central axis of the hole and wherein the first and second integrated circuits are in the hole symmetrically relative to the central axis of the hole.

11. A package according to claim 1 wherein the first and second steps are offset from one another relative to a central axis of the hole and wherein the first and second integrated circuits are in the hole symmetrically relative to the central axis of the hole.

12. A package according to claim 1 further comprising an encapsulant in the hole and that includes an outer surface that is coplanar with a face of the integrated circuit mounting substrate.

13. A package according to claim 1 wherein the integrated circuit mounting substrate includes an internal conductive pattern, wherein the first and second steps expose the internal conductive pattern in the hole and wherein the first and second sinuous lead frames are connected to the internal conductive pattern that is exposed by the respective first and second steps.

14. An integrated circuit package comprising:

an integrated circuit mounting substrate including a hole therein that defines an inner wall of the integrated circuit mounting substrate, the inner wall having first and second steps therein;

first and second integrated circuits in the hole; and first and second sinuous lead frames that extend from the first and second integrated circuits, respectively, and are connected to the first and second steps, respectively.

15. A package according to claim 14 wherein the first and second sinuous lead frames comprise U- and/or V-shaped sinuous lead frames.

16. A package according to claim 14 wherein the first and second sinuous lead frames comprise rounded and/or jagged sinuous lead frames.

17. A package according to claim 14 wherein the first and second sinuous lead frames extend back and forth along a given direction.

18. A package according to claim 5 wherein the first and second sinuous lead frames comprise U- and/or V-shaped sinuous lead frames.

19. A package according to claim 5 wherein the first and second sinuous lead frames comprise rounded and/or jagged sinuous lead frames.

20. A package according to claim 5 wherein the first and second sinuous lead frames extend back and forth along a given direction.

\* \* \* \* \*